United States Patent [19]
Countrywood et al.

[11] Patent Number: 6,110,540
[45] Date of Patent: *Aug. 29, 2000

[54] PLASMA APPARATUS AND METHOD

[75] Inventors: Joseph Countrywood, Napa, Calif.;
Sohrab Zarrabian, Summit; Abraham I. Belkind, North Plainfield, both of N.J.; Charlie Sherwood, Pacheco; Frank Jansen, Walnut Creek, both of Calif.

[73] Assignee: The BOC Group, Inc., New Providence, N.J.

[ * ] Notice: This patent issued on a continued prosecution application filed under 37 CFR 1.53(d), and is subject to the twenty year patent term provisions of 35 U.S.C. 154(a)(2).

[21] Appl. No.: 08/679,288

[22] Filed: Jul. 12, 1996

[51] Int. Cl.$^7$ ...................................................... H05H 1/24
[52] U.S. Cl. .......................... 427/569; 118/718; 118/719; 118/723 HC; 118/723 MP; 427/248.1; 427/444; 427/523; 427/595
[58] Field of Search ...................................... 427/523, 569, 427/595, 248.1, 535, 444; 118/718, 719, 723 HC, 723 MP

[56] References Cited

U.S. PATENT DOCUMENTS

| | | |
|---|---|---|
| 5,069,770 | 12/1991 | Glocker . |
| 5,078,494 | 1/1992 | Fraser ........................................ 356/311 |
| 5,106,474 | 4/1992 | Dickey et al. . |
| 5,224,441 | 7/1993 | Felts et al. ............................... 118/718 |
| 5,252,178 | 10/1993 | Moslehi ................................... 156/643 |
| 5,266,153 | 11/1993 | Thomas .................................... 156/643 |
| 5,271,963 | 12/1993 | Eichman et al. ...................... 427/248.1 |
| 5,302,424 | 4/1994 | Murai et al. . |
| 5,380,415 | 1/1995 | Poorman et al. . |
| 5,570,031 | 10/1996 | Sasaki et al. ............................. 324/750 |

FOREIGN PATENT DOCUMENTS

| | | |
|---|---|---|
| 0270144 | 6/1988 | European Pat. Off. . |
| 0 801 414 A2 | 4/1997 | European Pat. Off. . |

OTHER PUBLICATIONS

Patent Abstracts of Japan, vol. 010, No. 192 (E–417), Jul. 5, 1986 & JP 61 039521 A (Anelva Corp), Feb. 25, 1986, *abstract*.

Patent Abstracts of Japan, vol. 012, No. 202 (C–503), Jun. 10, 1988 & JP 63 006030 A (Kuraray co Ltd), Jan. 12, 1988, *abstract*.

Michael J. Patterson, et al., "Plasma Contactor Development for Space Station"; *NASA Technical Memorandum 106425, IEPC–93–246*; pp. 1–29 (1993). (No month avail.).

*Primary Examiner*—Bernard Pianalto
*Attorney, Agent, or Firm*—Philiph H. Von Neida; Salvatore P. Pace

[57] ABSTRACT

A gas purged counter-electrode prevents the counter-electrode from being covered with dielectric material by flowing gas past a surface of a metal element. The gas purged counter-electrode produces a relatively high-density plasma which effectively acts as the counter-electrode for a coating system. The gas purged counter-electrodes can be used with PECVD or sputtering systems.

43 Claims, 10 Drawing Sheets

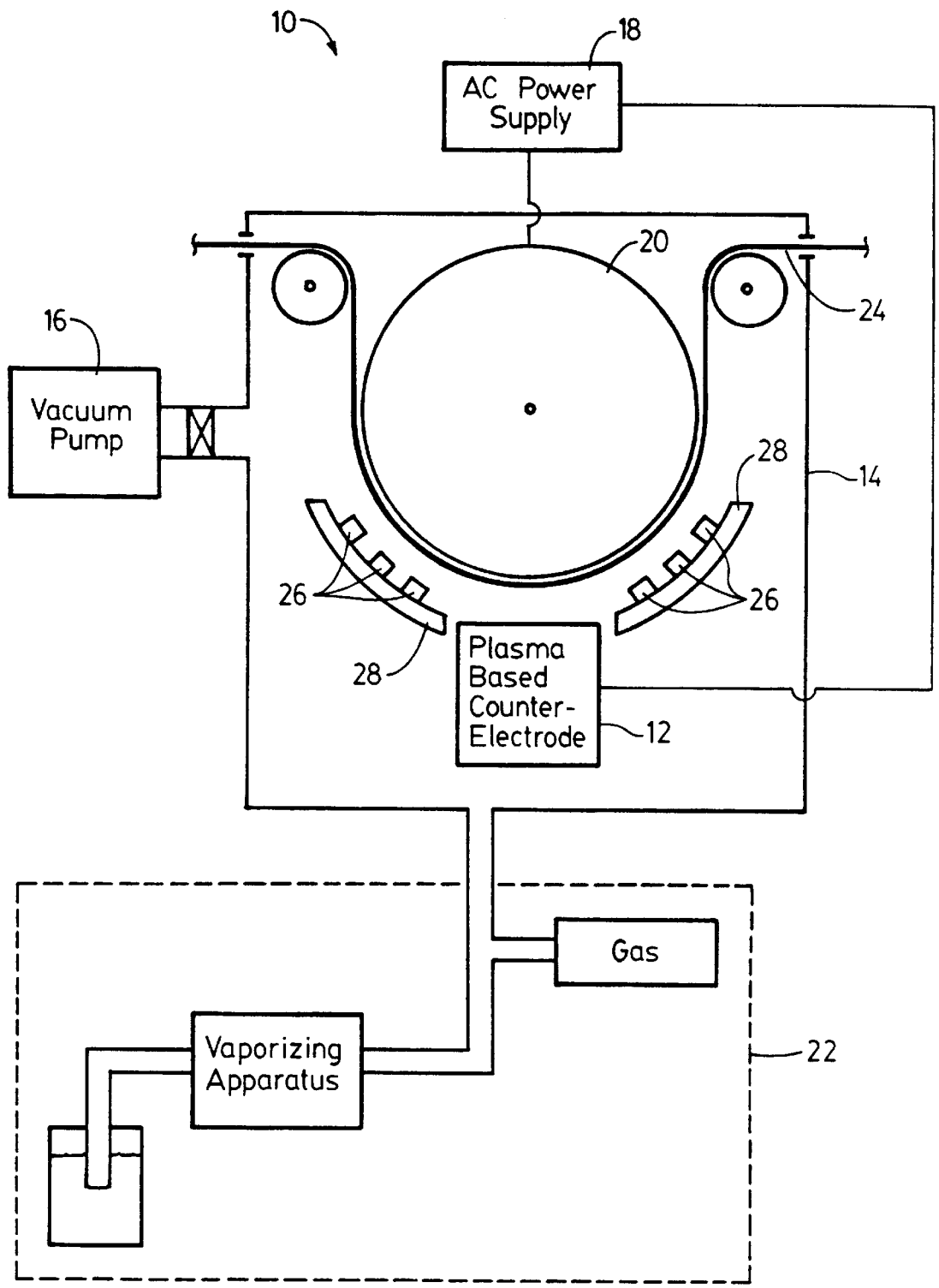
FIG._1.

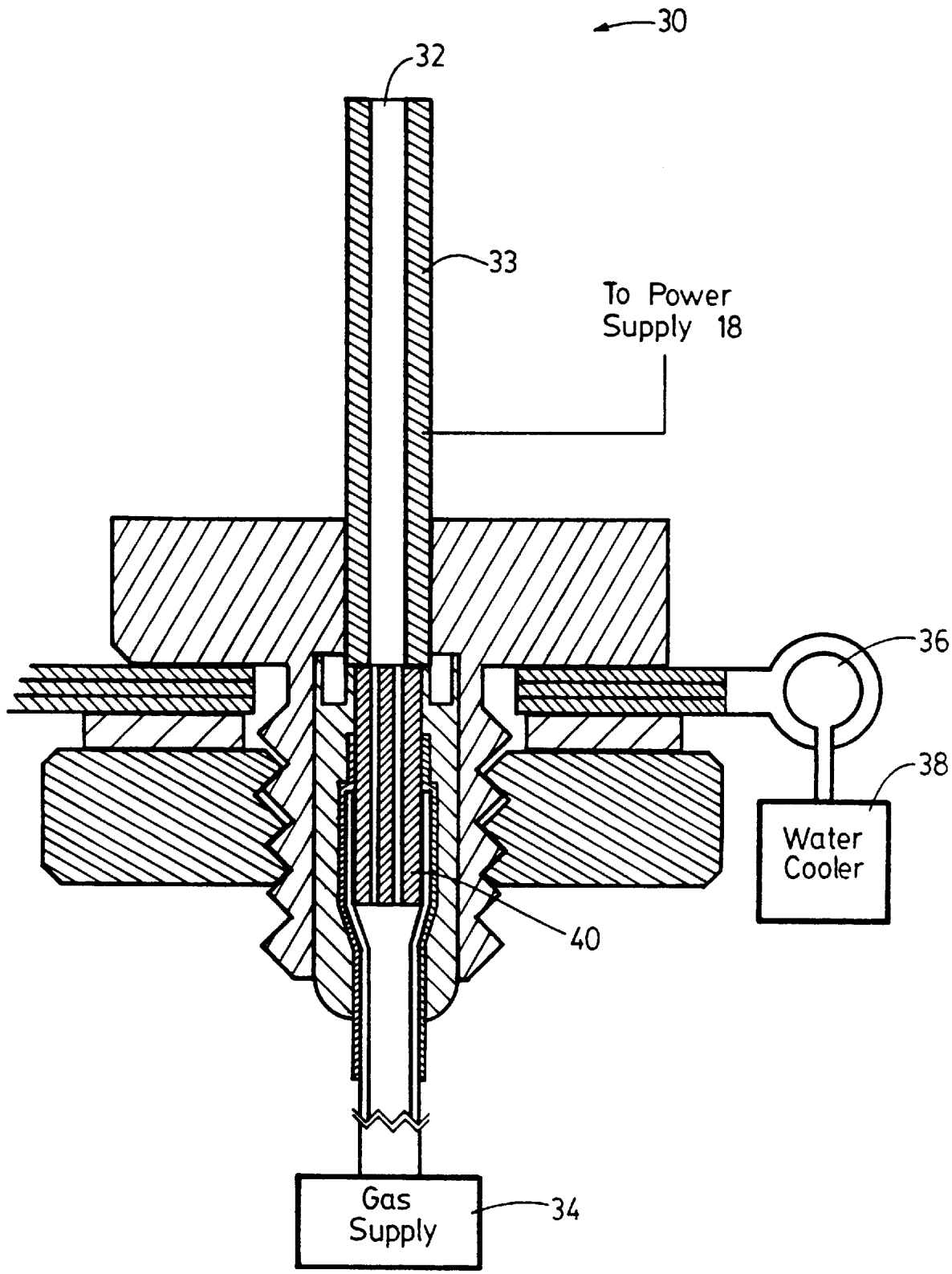
FIG._2A.

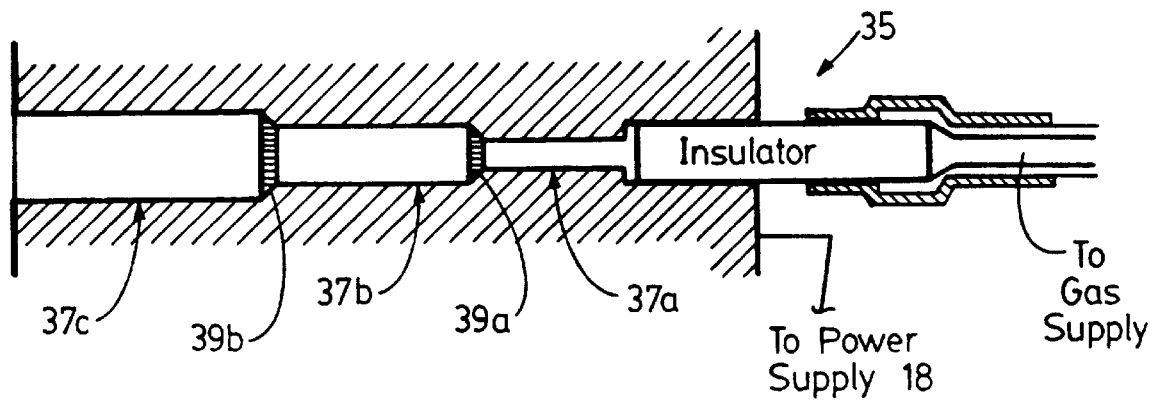
FIG._2B.
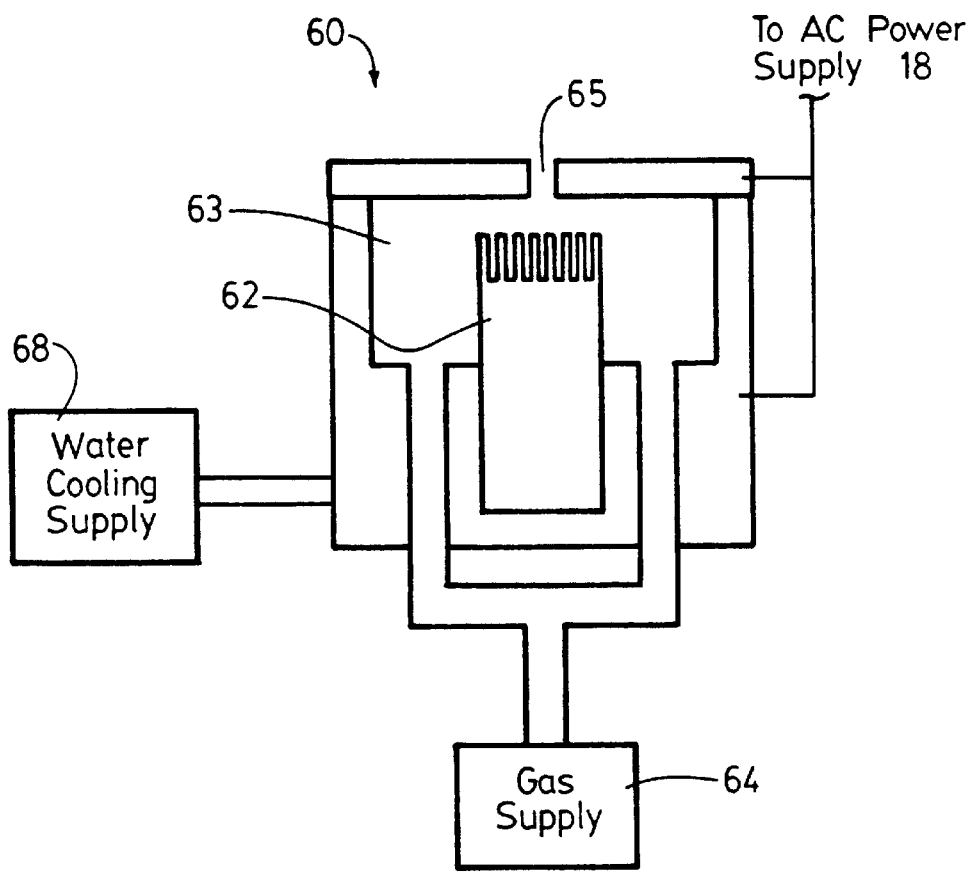
FIG._4.

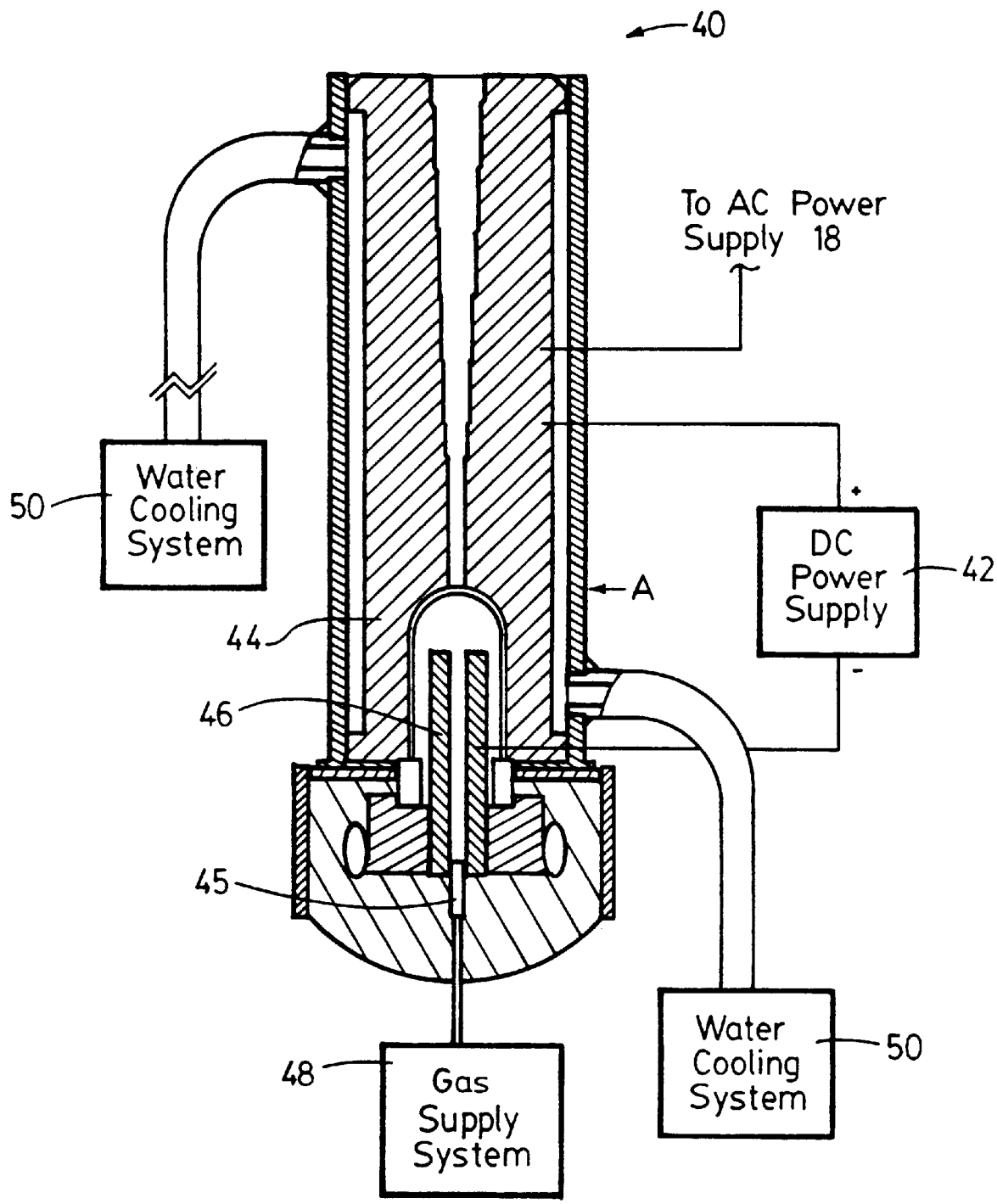
FIG._3A.

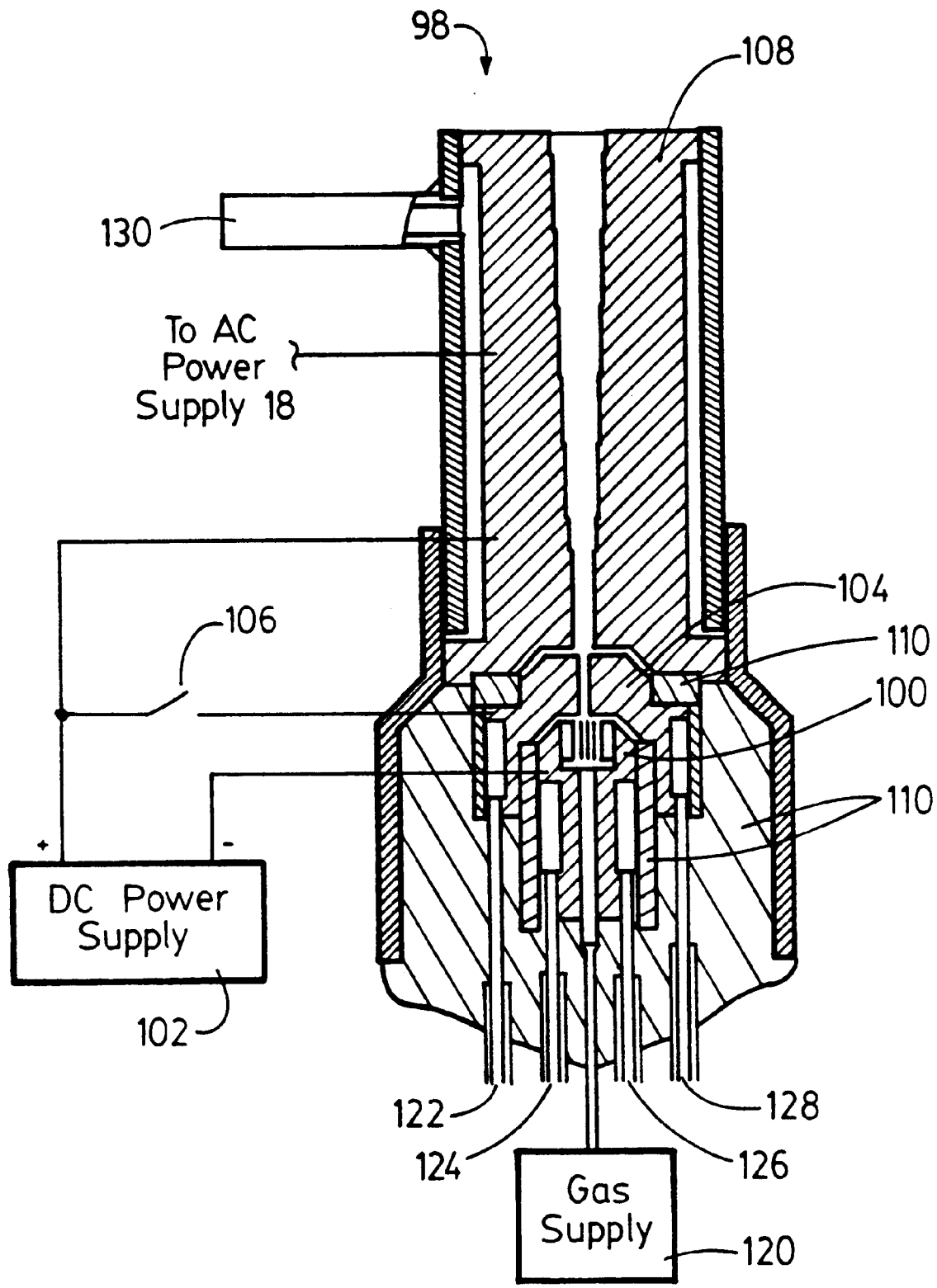
FIG._3B.

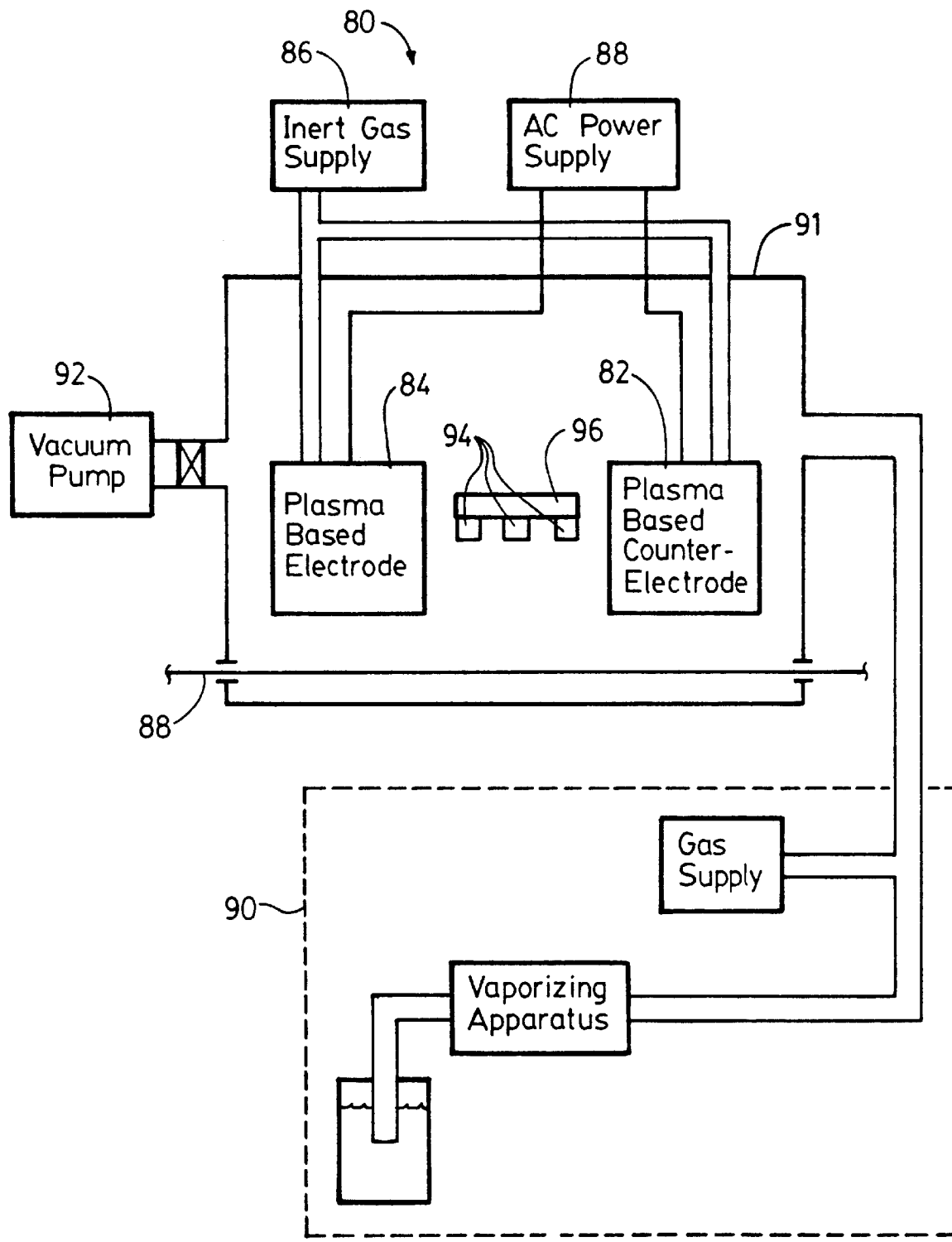
FIG._5.

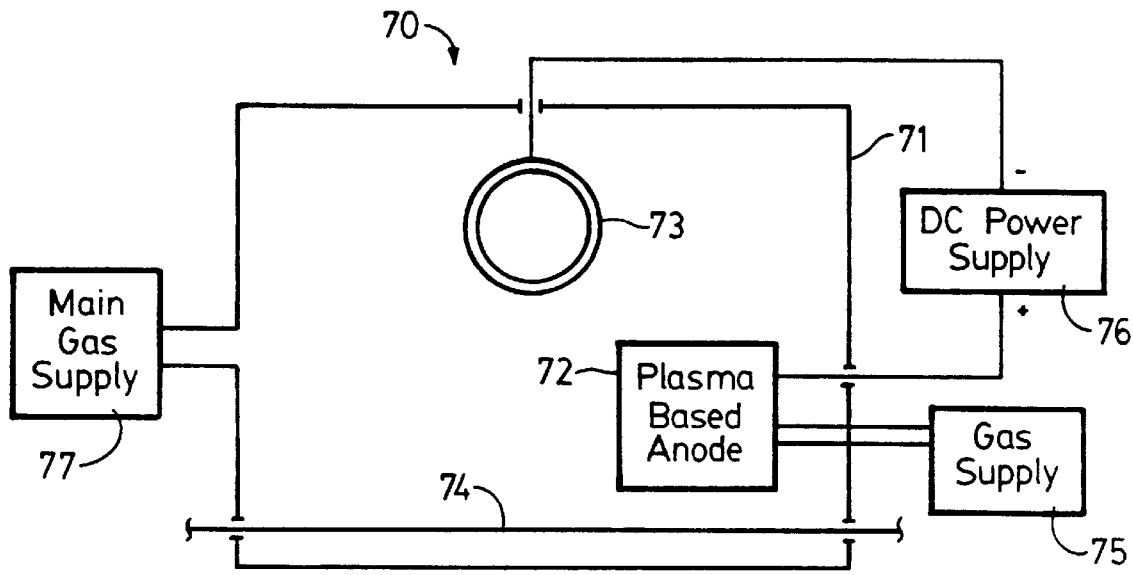
FIG._6.
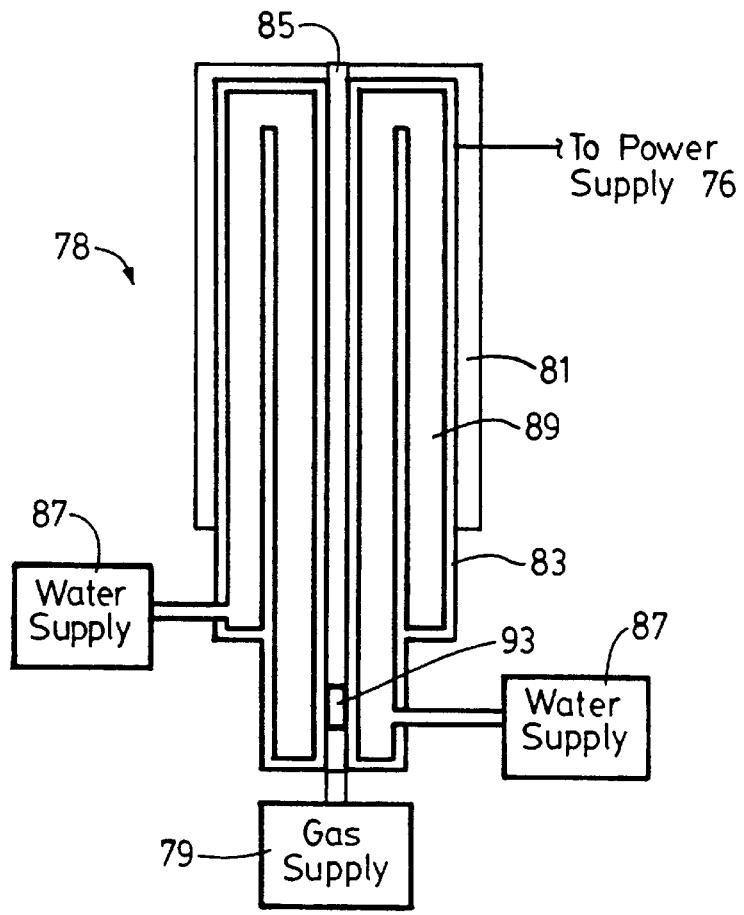
FIG._7A.

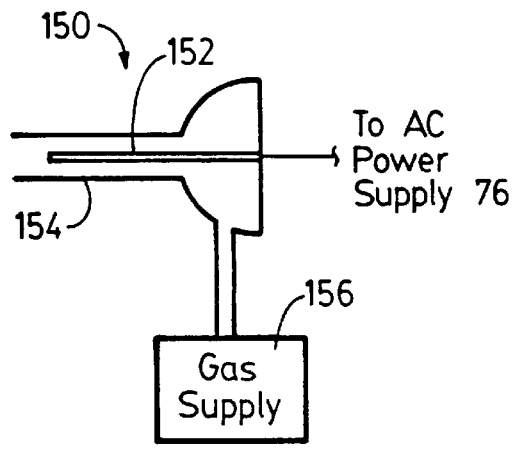
FIG._7B.
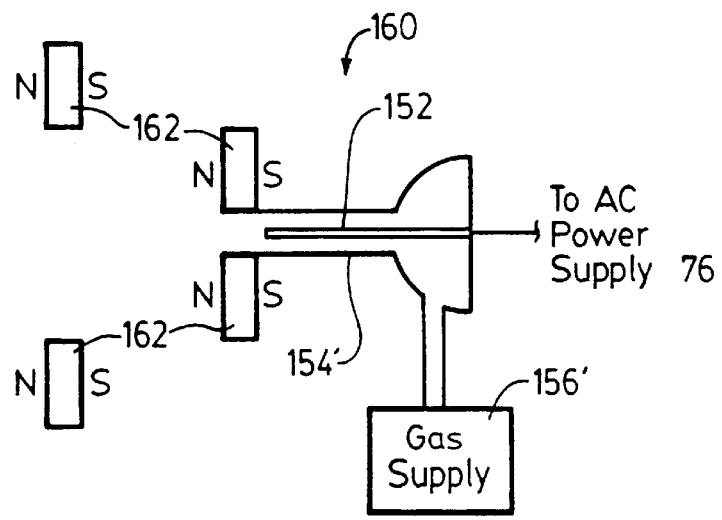
FIG._7C.
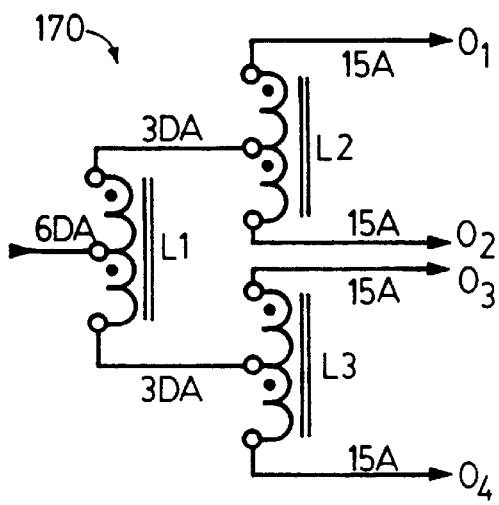
FIG._9.

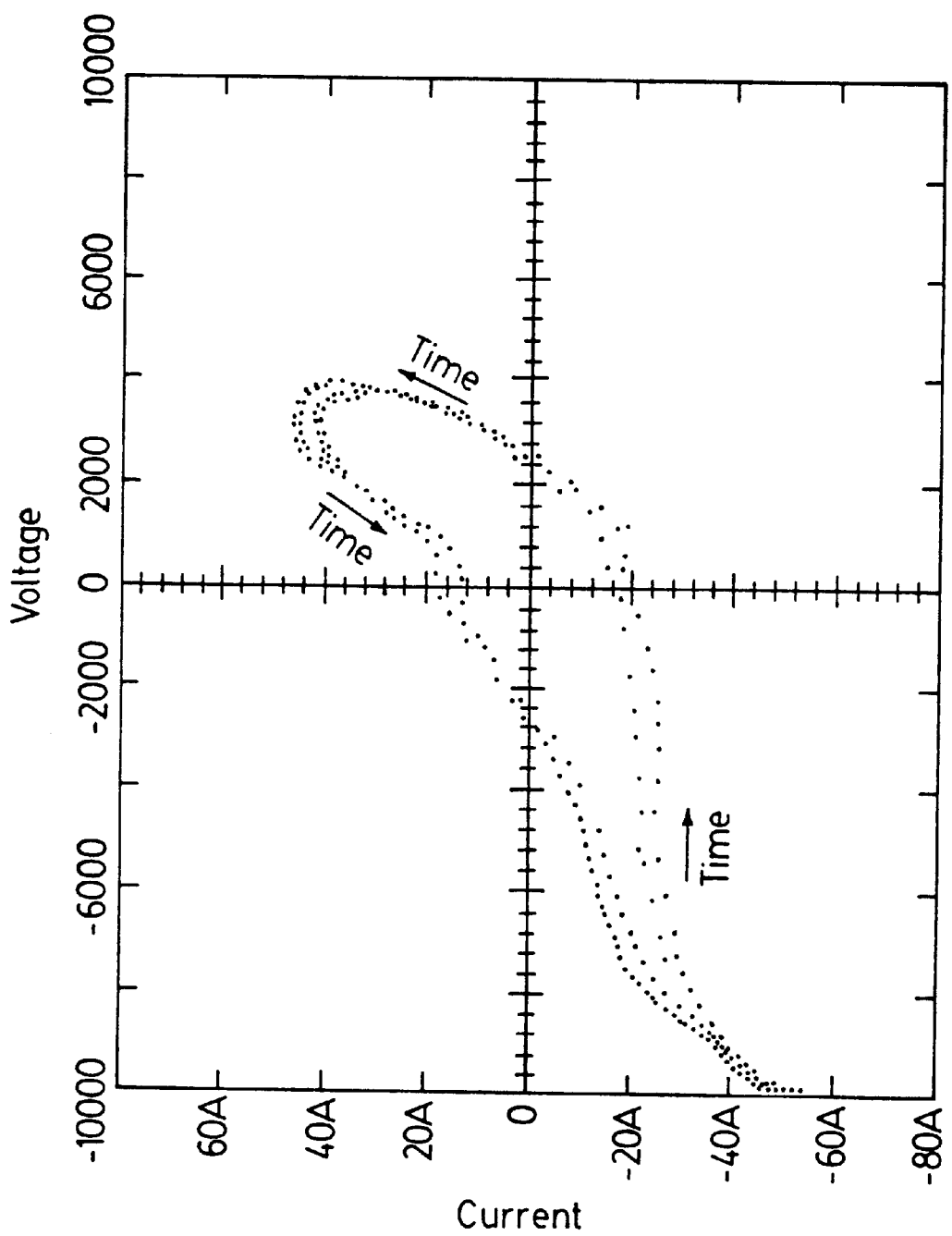
FIG._8A.

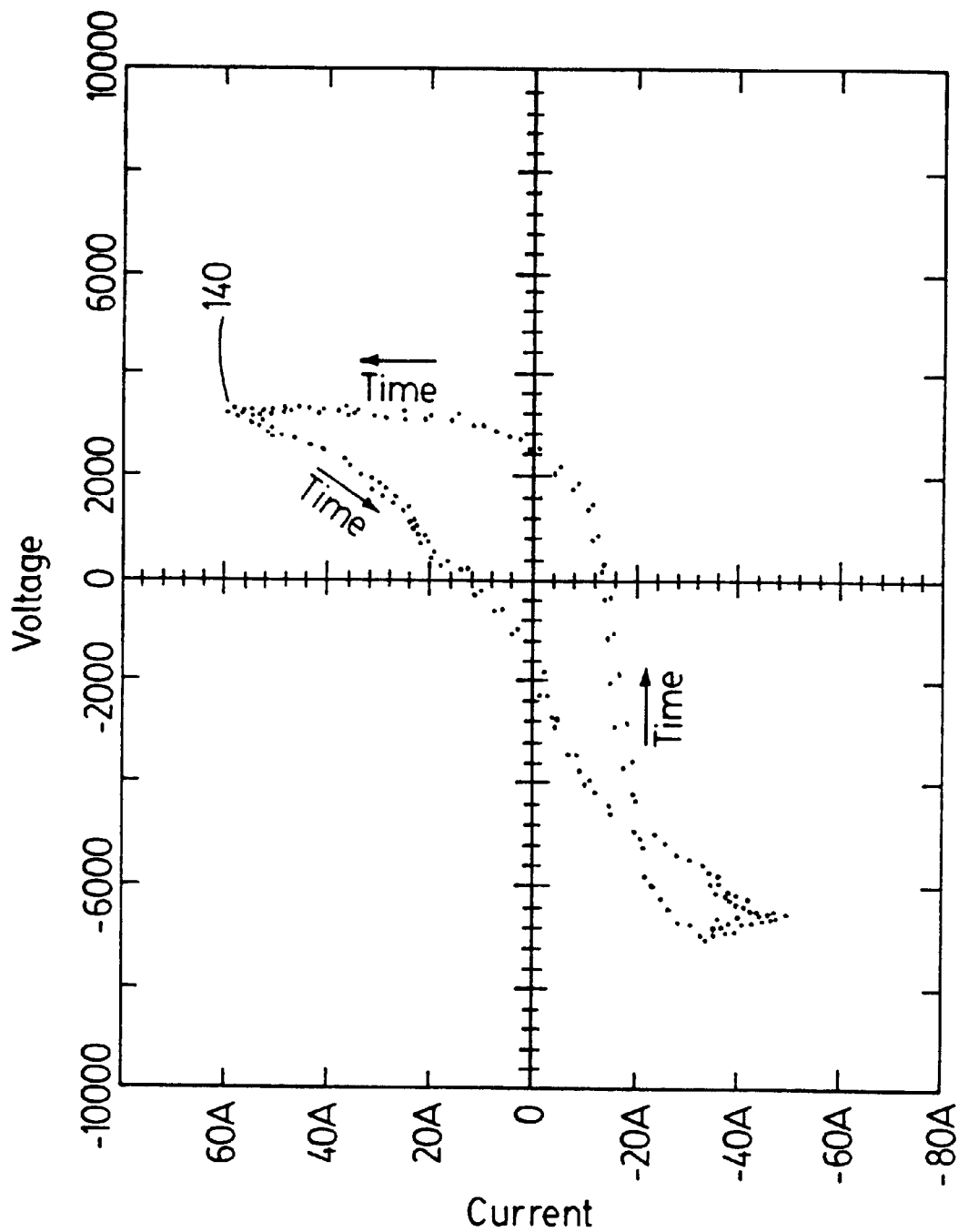
FIG._8B.

PLASMA APPARATUS AND METHOD

BACKGROUND OF THE INVENTION

The present invention relates to systems using electrodes in the deposition of a dielectric material on a substrate.

In such a system, the pressure is typically reduced from atmospheric pressure by a vacuum pumping system. Electrode surfaces are in electrical communication with gases introduced into the system such that an electrical discharge or plasma is formed. The purpose of this discharge is to excite moieties in the system and cause them to be deposited onto the workpiece or substrate to be coated.

One problem in such systems is that the electrodes can become contaminated with an insulating layer of the dielectric material intended for the substrate. The growth of dielectric deposits on the electrodes will result in a shift of the voltage/current characteristics of the system over time. The required operating voltage will increase for a given current as contamination of the electrode progresses. These changes cause a drift in the quality of the dielectric coating produced on the substrate, and require periodic cleaning of the electrodes. Furthermore, due to the high impedance presented to the plasma by a contaminated electrode, power will be wasted and excess heat generated. It is desired to have a process free of drift with a minimum of waste heat generated.

SUMMARY OF THE INVENTION

Electrodes using a gas supply to flow gas past a surface of the electrode can help prevent or reduce the deposition of material on the surface of the electrode. A gas supply associated with the electrode can maintain the gas pressure around the electrode greater than in other areas of the evacuated chamber. These gases form a second relatively high-density plasma associated with the electrode. This high-density plasma acts as an extension of the metallic electrode surface and lowers the impedance of the electrode. This electrode system will be referred to as a gas purged electrode. The benefit of using a gas purged electrode is that it provides a constant, low-impedance electrical contact with the process plasma. Since the impedance is constant, the process does not drift; since impedance is low, the whole process operates at a lower voltage and less power is wasted. The greater gas pressures around the gas purged electrode is continually replenished by the gas supply. The gas pressure differential between the area around the gas purged electrode and other areas of the evacuated chamber prevents reactive gases or other components from the main gas supply from approaching the gas purged counter-electrode. In a preferred embodiment, the gas supply passes through a tube that encloses the metal surface of the electrode. The purge gas can be any gas or mixture of gases which does not cause a buildup of material on the metallic electrode surface. It is typically an inert gas, such as helium, neon, or argon, or a mixture such as helium/neon or neon/argon. In reactive sputtering processes it can be oxygen, nitrogen or other reactive gases.

The gas purged electrodes of the present invention can be anodes used with direct current (DC) power supplies or can shift between acting as an anode and cathode when used with alternating current (AC) power supplies.

Two coating system applications are considered:
(1) plasma enhanced chemical vapor deposition systems producing dielectric coatings; and
(2) sputtering deposition systems producing dielectric or metallic coatings.

(1) Plasma Enhanced Chemical Vapor Deposition:

"Plasma enhanced chemical vapor deposition" (or PECVD) is a known technique used to form films on various substrates. For example, Felts, et al. U.S. Pat. No. 5,224,441 describes an apparatus for rapid plasma deposition. In the plasma enhanced chemical vapor deposition of silicon oxide, a gas stream including components such as a volatilized organosilicon compound, oxygen, and an inert gas such as helium or argon, is sent into an enclosed chamber at reduced pressure and a glow discharge plasma is established from the gas stream or its components. A silicon oxide layer is deposited upon the substrate when it is positioned near the plasma.

For the large-scale deposition of a dielectric material such as silicon oxide, typically a low-frequency radio-frequency (RF) power is supplied to electrodes to form the plasma. An alternating current (AC) power supply is used in order to capacitively couple power through the dielectric deposits that inevitably form on the electrodes, as well as to couple power through the substrate if it is covering one of the electrodes.

As described in the application of Felts, et al. U.S. Pat. No. 5,224,441, the substrate can move through the deposition zone loosely adhered to a rotating drum. The plasma is contained near the electrode, and thus the substrate, by magnets.

The gas purged counter-electrodes can be used in plasma enhanced chemical vapor deposition systems using AC power supplies. These electrodes use the purge gas to produce an intense plasma jet which is emitted into the evacuated process chamber. The jet, being a relatively high-density plasma, is very conductive and acts as the counter-electrode for the process plasma. The process plasma is sustained by RF power, supplied between the gas purged counter-electrode and another electrode. The other electrode can be a second gas purged electrode, or a metallic drum supporting a plastic web. Electrons or ions are easily drawn from the plasma associated with the gas purged counter-electrode, as required by the process plasma; hence, the net impedance of the plasma-based electrode is low in both the anode and cathode phases of the alternating current cycle.

The use of a gas purged counter-electrode means that the water-cooled magnet support plate need not be part of the electrical circuit. This reduces the heat generated at the water-cooled magnet support plate.

Producing a stable plasma is necessary for the production of consistent quality dielectric coatings. Even for plasma deposition systems using alternating current power, the growth of dielectric deposits on the electrodes will result in a shift of the voltage/current characteristics of the system over time. The required operating voltage will increase and the thus current will decrease for a given level of power. These changes cause a drift in the properties of the dielectric coating produces, and require the periodic cleaning of the electrodes. It is possible to protect one of the electrodes from dielectric deposition by covering it with the substrate to be coated. However, the problem of dielectric coating build-up on the other or counter-electrode remains.

In AC systems, the plasma is extinguished each cycle as the voltage goes to zero. In order to reduce the voltage required for initiation of the plasma during the next cycle, it is preferable that a metal element in the counter-electrode be heated or allowed to heat up. This metal element is preferably made of a refractory metal, such as tantalum, tungsten or molybdenum.

The refractory metal element can be heated to thermionic temperatures in multiple ways. One way is to use a hollow electrode or tube. A purge gas flows through a hollow refractory metal tube that is electrically connected to the alternating current power supply. The hollow electrode is allowed to heat up at one end to thermionic temperatures by cooling only the gas inlet end. The thermionic emission of electrons lowers the voltage at which conduction begins on the next cycle.

Alternately, a refractory metal element can be put in a cooled metal cavity with a pinhole between the cavity and the evacuated chamber. A purge gas is supplied to the cavity and, because of the pinhole, the gas pressure can be much greater in the cavity than in the remainder of the evacuable chamber. A dense plasma is formed through the pinhole and becomes the electrical communication between the chamber plasma and the power supply.

Additionally, a DC arc approach can be used. In the DC arc approach, the counter-electrode consists of a "cathode" and "anode" between which an arc is obtained by a separate direct current power supply. The arc approach relies upon the operation of the "cathode" at high surface temperatures. Thermionically emitted electrons are thus available to supply the process plasma when required. In this regime, the arc operates at very low voltages (around 10 to 20 volts) and high currents; thus, there is no appreciable sputtering. Because of the high operating temperatures, the materials for use as the "cathode" are preferably refractory metals, such as tantalum, tungsten or molybdenum. The DC voltage is maintained between two metallic elements in the counter-electrode so that the counter-electrode plasma does not extinguish as the alternating current changes polarity.

2) Sputtering Applications:

Gas purged counter-electrodes used with DC power sources, such as in sputtering systems, are used as the anodes of the system. A hollow anode or a metal element enclosed in a gas tube can be used. Additionally, since the plasma associated with the gas purged counter-electrodes need not be reignited each cycle, "cold" anode systems can be used. In a "cold" anode system, water cooling is used for the entire electrode.

An additional embodiment of the present invention uses magnets to shape the plasma associated with the gas purged electrode. Since the plasma associated with the counter-electrode effectively acts as the counter-electrode, the magnets can modify the system characteristics.

The use of the gas purged electrodes of the present invention allow for continuous, stable operation of a process plasma for depositing dielectrics, without the adverse effects of process drift due to a dielectric coating of the electrodes. Furthermore, by allowing a low impedance path between plasma and power supply, the invention allows the process plasma to run at lower operating voltage, thereby reducing wasted energy.

When multiple gas purged electrodes are used as anodes in a sputtering application, the impedence of each electrode can be controlled by the gas flow and composition. An increase in gas flow to a given electrode will decrease the impedence. This characteristic provides a handy means of balancing the current between multiple electrodes. Varying the gas type can have a similar effect. The present invention has particular value when applied to large commercial coaters.

BRIEF DESCRIPTION OF THE DRAWINGS

The above and other features and aspects of the present invention will become more apparent upon reading the following detailed description in conjunction with the accompanying drawings, in which:

FIG. 1 is a diagram showing a PECVD coater structure using a gas purged counter-electrode of the present invention.

FIGS. 2A–B are diagrams of hollow electrode systems used as the gas purged counter-electrode.

FIGS. 3A–3B are diagrams of direct current arc systems used as the gas purged counter-electrode in the present invention.

FIG. 4 is a diagram of a thermionic system used as the gas purged counter-electrode in the present invention.

FIG. 5 is a diagram showing an alternate coater structure using two gas purged electrodes.

FIG. 6 is a diagram of a direct current sputtering system using a gas purged anode.

FIGS. 7A, B and C are diagrams of gas purged anodes for use with the sputtering system of FIG. 6.

FIG. 8A is a graph showing the drum voltage versus drum current characteristics of a system using a metal plate as the counter-electrode.

FIG. 8B is a graph showing the drum voltage versus drum current characteristics of a system using a gas purged counter-electrode.

FIG. 9 is a diagram of a transformer arrangement that can be used with a multiple counter-electrode system.

DETAILED DESCRIPTION OF THE DRAWINGS

Two main plasma treating apparatuses use the gas purged counter-electrode of the present invention, sputtering systems in which the process plasma is used to sputter off of a target for deposition on a substrate, and plasma-enhanced chemical vapor deposition systems.

FIG. 1 is a diagram of a plasma-enhanced chemical vapor deposition system 10 using a gas purged counter-electrode 12 of the present invention. Details of different embodiments used as the gas purged counter-electrode 12 for a PECVD system are given below with respect to FIGS. 2A, 2B, 3A, 3B and 4. The plasma-enhanced chemical vapor deposition system 10 includes an evacuable chamber 14. This evacuable chamber 14 can be pumped by the vacuum pump 16. An alternating current power supply 18 is used to produce a process plasma between the drum electrode 20 and the counter-electrode 12. The alternating current power supply preferably provides power at around 40 kHz. The gas for the process plasma between the drum electrode 20 and the counter-electrode 12 is supplied by gas supply 22.

In a preferred embodiment, the electrode 20 comprises a roller drum. The substrate 24 is placed over the roller drum 20, thus protecting the roller drum 20 from being coated by the dielectric materials. The problem is maintaining a stable counter-electrode.

In prior art systems, such as Felt, et al. U.S. Pat. No. 5,224,441, a cooled plate used to support magnets is used as the counter-electrode. Since the present invention uses a gas purged counter-electrode 12, magnets 26 can be supported by a cooled plate 28 which is coated with a dielectric to prevent sputtering off of its surface. The gas purged counter-electrode 12 can also be supported by this cooled plate 28.

In a preferred embodiment, the gas flowing from supply 22 includes a volatilized organosilicon compound, oxygen and an inert gas such as helium or argon. In the plasma-enhanced chemical vapor deposition, the organosilicon compound and oxygen react and are deposited upon the substrate 24 to form a silicon oxide (SiOx) layer. As will be described below, the gas purged counter-electrode systems 12 typically have a separate gas supply which supplies gases which do not by themselves react to form a dielectric material. These gases are used to form the second (counter-electrode) plasma about the gas purged counter-electrode. Since this counter-electrode plasma does not by itself form a dielectric layer, the counter-electrode 12 will not be coated by dielectric material. Because of the relatively low gas pressure in the chamber 14, the purge gases prevent other reactive gases from supply 22 from flowing near the counter-electrode 12.

As is discussed below with respect to each embodiment, the gas purged counter-electrode produces a plasma that effectively acts as the counter-electrode of the system.

A good counter-electrode for use with an alternating current power supply must function both as an anode (at positive potential) and a cathode (at negative potential) during successive half cycles of the applied alternating current potential.

A good anode is achieved by the flowing of an inert purge gas over a clean metal surface. The purge gas effectively sweeps film-forming impurities out of the electrode area and thus prevents the formation of deposits on the clean metal surfaces.

During the half cycle that the counter-electrode acts as a cathode, it is currently believed that the counter-electrode must deliver a large supply of electrons. The associated plasma of the gas purged counter-electrode is used to create this large supply of electrons. A second (counter-electrode) plasma is preferably produced from gases, such as inert gases, that do not form a dielectric coating on the counter-electrode. Since no dielectric coating is formed on the counter-electrode, there is no drift in the process. The presence of an intense plasma jet associated with the counter-electrode dramatically reduces the impedance of the counter-electrode, thereby improving the process plasma stability and reducing the power required by the main power supply.

FIGS. 2A and 2B are diagrams of a hollow electrode gas purged counter-electrode system. The hollow electrode 30 includes a hollow chamber 32. The hollow electrode 30 relies on the operating voltage of the alternating current power supply 18 shown in FIG. 1 to initiate the counter-electrode plasma at every cycle. The counter-electrode works alternately as the cathode and the anode. The counter-electrode plasma may be extinguished as the voltage of the counter-electrode moves from one polarity to the other. Re-ignition occurs at each half cycle. A purge gas is supplied by gas supply 34. The gas of the purge gas from gas supply 34 is preferably an inert gas, such as helium, neon or argon, or a mixture thereof.

The device 30 includes a hollow manifold 36 through which cooling water can flow. The cooling water is supplied by water cooling system 38. In the preferred embodiment, a purge gas flows through the tube at the rate of 50 standard cubic centimeters per minute (sccm). The diameter of the chamber should be less than about $\frac{1}{8}$th of an inch for currents in the range of 25 amps.

In the preferred embodiment, the hollow metal element 30 is made of a refractory metal. Since the top portion of the hollow metal element 30 is not cooled, the hollow tube can heat up to thermionic temperatures that help maintain the plasma. Cathodes such as cathode 30 seem to require a minimum operating voltage of about −300 volts to ignite the counter-electrode plasma when cold. It is currently believed that electrons are initially supplied to the process from the secondary electron emission from the inside diameter surface of the counter-electrode. Once the metal tube 30 is heated by operation, the operating voltage reduces to about −100 volts and the ignition voltage goes to zero. This is currently believed to be due to the thermionic emission of electrons from the metal tube 30 to the associated plasma.

When the counter-electrode 30 acts as an anode, the purge gas flowing from the gas supply 34 prevents any dielectric material from forming on the inside of the chamber 32. This is an advantage even if the gas pressure and power supply are such that a counter-electrode plasma is not formed when the counter-electrode acts as a cathode.

A ceramic piece 40 with a small hole is used to prevent the counter-electrode plasma from moving back closer toward the gas supply. The counter-electrode plasma is extinguished if it attempts to move back through the ceramic piece 40.

FIG. 2B is an alternate embodiment of a hollow electrode system 35. This system has a hollow tube with sections having different diameters.

FIG. 8A is a graph showing the drum voltage versus drum current characteristics of a system using a metal plate as the counter-electrode. FIG. 8B is a graph showing the drum voltage versus drum current characteristics of a system using a gas purged counter-electrode, such as the hollow electrode. In both of the diagrams, the density of the dots gives an indication of the amount of time spent with that drum voltage/current characteristic. Note that the system using the hollow electrode produces higher current at a lower voltage at in the region 140 when the drum acts as an anode and the counter-electrode acts as a cathode than the metal plate counter electrode does. Additionally, at a drum voltage of about around 320 volts, the current quickly increases. The impedance of the gas purged counter-electrode is low in this region.

FIGS. 3A–3B show a direct current arc gas purged counter-electrode. Looking at FIG. 3A, the direct current arc gas purged electrode 40 uses a direct current power supply 42 to produce a voltage potential between a first metal element 44 and a second metal element 46. The second metal element 46 is kept at a negative potential compared to the metal element 44. Thus, the element 46 can be described as the "cathode" and element 44 can be described as the "anode." Of course, the total gas purged counter-electrode 40 acts as the anode or cathode for the process plasma since element 44 is connected to the alternating current power supply of FIG. 1. Looking again at FIG. 3A, between the metal elements 44 and 46, an arc is maintained by the direct current circuit 42. The arc approach relies on the operation of the metal element at high surface temperatures so that the counter-electrode plasma is obtained by thermionically emitted electrons. In this regime, the arc operates at very low voltages, around 10 to 20 volts, and high currents, so that there is less sputtering than with the hollow electrode approach. Because of the high operating temperatures, the metal element 46 is preferably a refractory metal, such as tantalum, tungsten or molybdenum. This system also uses a gas supply 48 which supplies the gases that prevent the formation of a dielectric layer on the metal material 46. In an alternate design for the metal element 44, a flat surface with a pinhole at point A. Also used is a cooling water supply 50. In the embodiment shown, a ceramic element 45 is used to prevent a plasma from flowing back to the gas supply system 48.

FIG. 3B is an alternate embodiment of a DC power system. A metal piece 100, preferably made of a refractory metal, is connected to a negative pole of the direct current power supply 102. To start the direct current arcing, a metal pilot element 104 is connected by switch 106 to the positive pole of direct current power supply 102. After the direct current arcing has started, switch 106 can be opened and the arcing will occur between metal piece 100 and metal piece 108. In this way, the initiation of the direct current arcing is made easier. High pressure in the pilot area makes the arcing possible and results in longer life for the system. The cathode area is not sputtered because the gases in this area are under relatively high gas pressures. The arcing is drawn from the pilot to the lower pressure area around metal piece 108. When electrons are needed by the process plasma, current is drawn from this arc. An ion detector can be used to detect the initiation of arcing and open switch 106. The direct current power supplies used with the embodiments of FIGS. 3A–3B are preferably the type used with welding equipment that produce a few seconds of alternating current power to aid in the initiation of the arc. Gas is supplied by noble gas supply 120. Cooling water is supplied through ports 122, 124, 126, 128, and 130. The metal pieces 100, 104 and 108 are separated by ceramic elements 110. Element 108 is connected to the alternating current power supply 18 of FIG. 1 so that the direct current arc system 98 acts as a counter-electrode.

FIG. 4 shows an alternate embodiment of the present invention that comprises a counter-electrode 60 with a metal element 62 having grooves. The metal element 62 is preferably made of a refractory metal that can be heated to thermionic temperatures. Gases from supply 64 flow around the metal up to element 62 and prevent it from being coated with dielectric materials. The metal element 62 is preferably formed of a refractory metal, such as tantalum, tungsten or molybdenum. The metal element 62 could be replaced by coils of refractory metal wire or small loose pieces of refractory metal. The counter-electrode 60 forms a cavity 63 with a pinhole 65 out to the evacuated chamber. The gas pressure in the cavity 63 can be much greater than in the remainder of the evacuable chamber.

This aids in the forming of the plasma that flows through the pinhole. In a preferred embodiment, the pinhole is about ½ a millimeter in diameter. This system also uses a water cooling supply 68.

FIG. 5 shows an alternate embodiment of a coater system 80 using the gas purged counter-electrode of the present invention. This system uses two gas purged electrodes, gas purged counter-electrode 82 and gas purged electrode 84. Both of these gas purged electrodes are supplied with a gas which does not form a dielectric layer on the gas purged electrode and counter-electrode. This gas is preferably an inert gas from an inert gas supply 86. The gas purged electrode and gas purged counter-electrode are preferably connected to the alternating current power supply 88. A plasma around each electrode is comprised of gases from the inert gas supply 86. These gases act as purge gases and prevent any of the other gases from the gas supply 90 from coating counter-electrode 82 or electrode 84. The gases from gas supply 90 will flow between the electrode and counter-electrode so that a process plasma will be formed between these two electrodes which includes the reactive gases. This process plasma forms a dielectric layer onto the substrate 88 which moves through the evacuated chamber 91. The vacuum pump 92 keeps the gas pressure in evacuated chamber 91 at the desired level. The magnets 94 help shape the process plasma including the reactive gases around the substrate 88. The cooling plate 96 can hold the magnets 94 and in an alternate (not shown) embodiment can hold the electrodes 82 and 84.

Flowing a supply gas past an electrode so that a relatively dense plasma is formed around the electrode may be useful in other systems as well. FIG. 6 is a diagram of a direct current sputtering system 70 using a gas purged anode 72 in an evacuable chamber 71. In a sputtering system, the cathode includes a target 73, which may be planar or cylindrical. Ions sputter material off of the target to be deposited on the substrate 74. A process plasma containing the ions can be confined around the target with magnets (not shown). In reactive sputtering, the material sputtered off of the target reacts with gas in the chamber.

Gases, preferably inert gases, are supplied to the gas purged anode 72 from gas supply 75. The direct current power supply 76 is connected to the cathode 71 and gas purged anode 72. Other gases can be supplied by the main gas supply 77.

Advantages of using a gas-purged anode 72 include the reduction of deposition on the anode and thus the stabilization of the system, as well as reducing the voltage level required for sputtering.

FIGS. 7A, 7B and 7C show a hollow electrode 78 which uses a gas supply 79. The hollow electrode is supplied with a gas by the gas supply 79. The hollow electrode 78 includes a metal portion 83 including a hollow chamber 85. The hollow electrode 78 can be surrounded by a ceramic piece 81. The hollow electrode 78 preferably uses water cooling from water cooling supply 87 into a manifold 89. The entire anode can be cooled by the water supply because a "cold" anode system is sufficient for use with a DC power supply. A ceramic element 93 can be used to prevent the plasma from flowing back to the gas supply 79.

Since the hollow anode 78 is used with a direct current power supply, the plasma around the anode is not extinguished as can occur with an alternating current power supply. Gas purged anodes used with a direct current power supply need to efficiently collect electrons and dissipate heat. Copper is preferably used for the gas purged anode because it dissipates heat well and keeps clean from deposited material.

FIG. 7B shows an alternate embodiment of a gas purged counter-electrode 150 using a metal element 152 and a ceramic shell 154 for directing the purge gas from gas supply 156.

FIG. 7C shows another alternate embodiment of a gas purged counter-electrode 160. This embodiment shows the use of magnets 162 to shape the plasma associated with the gas purged counter-electrode 160. The shaping of the plasma associated with the gas purged counter-electrode 160 can effect the electrical characteristics of the system. Magnets such as magnets 162 can be used with the PECVD process as well.

FIG. 9 is a diagram of a transformer arrangement 170 that can be used with a multiple counter-electrode system. Transformers such as transformers L1–L3 can be used with an AC power supply so that the current drawn by the multiple counter-electrodes is roughly equal. This prevents one of the counter-electrodes from dominating and thus preventing the other counter electrode from turning on.

Additionally, the gas supplied to the counter-electrodes can be individually regulated to tune the current through the counter-electrodes so that no one counter-electrode dominates. By reducing the gas flow to a counter-electrode, the impedance of the plasma will go up and the current through the counter-electrode will be reduced.

Various details of the implementation and method are merely illustrative of the invention. It will be understood that various changes in such details may be within the scope of the invention, which is to be limited only by the appended claims.

What is claimed is:

1. A plasma treatment apparatus, comprising:
a chamber for evacuation;
a first electrode in said chamber electrically connected to a power supply, said first electrode capable of producing a first plasma when a first gas is supplied to said chamber; and
a second electrode in said chamber electrically connected to the power supply, said second electrode including an electrically conductive surface within a partially enclosed space, said second electrode for producing a second plasma when a second gas is supplied thereto and the surface thereof capable of being heated to a thermionic temperature when the second gas flows thereby to said chamber, the second gas alone being incapable of forming a dielectric material, the second gas providing a pressure in a vicinity of said second electrode which is greater than a pressure elsewhere in said chamber.

2. The apparatus of claim 1, wherein said second electrode comprises a hollow structure defining the partially enclosed space and wherein the second gas flows through the hollow structure.

3. The apparatus of claim 1, wherein said second electrode comprises a metal element around which the second gas flows.

4. The apparatus of claim 3, wherein the metal element is made of a refractory metal.

5. The apparatus of claim 1, wherein the power supply provides alternating current power having an alternating current cycle and said second electrode initiates the second plasma at each half cycle of the alternating current cycle.

6. The apparatus of claim 1, wherein said second electrode comprises two metal elements electrically connected to a second power supply for providing direct current power thereto.

7. The apparatus of claim 6, wherein one of the two metal elements is made of a refractory metal.

8. The apparatus of claim 1, wherein the first plasma is a process plasma in a plasma-enhanced chemical vapor deposition process.

9. The apparatus of claim 1, wherein the first plasma is a process plasma in a sputtering process.

10. The apparatus of claim 9, wherein the power supply provides direct current power, said first electrode comprises a cathode, and said second electrode comprises an anode.

11. The apparatus of claim 9, wherein the power supply provides alternating current power.

12. The apparatus of claim 1, comprising more than one second electrode in said chamber.

13. The apparatus of claim 12, wherein a flow of the second gas to one second electrode and another flow of the second gas to another second electrode are capable of being regulated independently of each other.

14. The apparatus of claim 1, the first gas providing pressure in a vicinity of said first electrode which is greater than pressures elsewhere in said chamber excluding the pressure in the vicinity of the second electrode.

15. The apparatus of claim 1, wherein said second electrode comprises magnets.

16. The apparatus of claim 1, wherein the partially enclosed space communicates with said chamber via a pinhole.

17. The apparatus of claim 16, wherein the electrically conductive surface of said second electrode comprises metal pieces.

18. The apparatus of claim 1, wherein a pressure in the partially enclosed space is significantly greater than a pressure elsewhere in said chamber.

19. A plasma treatment apparatus, comprising:
a chamber for evacuation;
a first supply for supplying at least one first gas to said chamber;
a first electrode and a second electrode within said chamber, said second electrode comprising an electrically conductive surface within a partially enclosed space that communicates with said chamber via a pinhole, said first and second electrodes electrically connected to a power supply for producing a plasma comprising the first gas; and
a second supply for supplying at least one inert gas to said second electrode in a flow passing over a surface of said second electrode, said flow passing through the partially enclosed space to said chamber.

20. The apparatus of claim 19, wherein the plasma is a process plasma in a sputtering process.

21. The apparatus of claim 19, wherein the plasma is capable of forming a dialectic material and wherein a flow of the inert gas helps keep the surface of said second electrode free of dielectric material.

22. The apparatus of claim 19, wherein said second electrode comprises a hollow structure, the surface being within the hollow structure and the flow passing through the hollow structure.

23. The apparatus of claim 19, wherein said second electrode comprises a metal element, the flow passing around the metal element.

24. The apparatus of claim 19, wherein the inert gas forms a second plasma in a vicinity of said second electrode.

25. The apparatus of claim 24, wherein said second electrode comprises magnets.

26. The apparatus of claim 24, wherein said second electrode comprises a metal element capable of being heated to a thermionic temperature.

27. The apparatus of claim 19, wherein said first supply supplies at least one component not supplied by said second supply.

28. The apparatus of claim 19, comprising more than one second electrode.

29. The apparatus of claim 28, wherein a flow of the inert gas to one second electrode and another flow of the inert gas to another second electrode are capable of being regulated independently of each other.

30. The apparatus of claim 19, wherein the power supply provides direct current power and said second electrode comprises an anode.

31. The apparatus of claim 19, wherein the power supply provides alternating current power.

32. A plasma-enhanced chemical vapor deposition apparatus, comprising:
a chamber for evacuation;
a first supply for supplying at least one first gas to said chamber;
a first electrode and a second electrode within said chamber, said first and second electrodes electrically connected to an alternating current power supply for producing a first plasma comprising said first gas and capable of forming a dielectric material; and
a second supply for supplying at least one inert gas to said second electrode for producing a second plasma comprising said inert gas.

33. The apparatus of claim 32, wherein said second electrode comprises a hollow structure.

34. The apparatus of claim 32, wherein said second electrode comprises two metal elements electrically connected to a direct current power supply.

35. The apparatus of claim 32, wherein said second electrode comprises a metal element capable of being heated to a thermionic temperature.

36. The apparatus of claim 32, wherein the second plasma is temporally extinguished when a potential of said second electrode switches polarity.

37. The apparatus of claim 32, further comprising a web disposed on said first electrode.

38. The apparatus of claim 32, wherein said first supply supplies at least one component not supplied by said second supply.

39. A plasma treatment method, comprising:
   providing an evacuated chamber with a first electrode and a second electrode electrically connected to a power supply, the second electrode comprising an electrically conductive surface within a partially enclosed space;
   supplying a first gas within said chamber to produce a first plasma;
   supplying a second gas to the second electrode such that a second plasma is formed and a pressure in a vicinity of the second electrode is greater than a pressure elsewhere in the chamber, said supplying including passing the second gas through the partially enclosed space over the surface of the second electrode and heating the surface to a thermionic temperature.

40. The method of claim 39, wherein said providing includes providing the power supply as an alternating current power supply and said supplying of the second gas to the second electrode such that the second plasma is formed includes providing electrons via the second plasma when the second electrode is cathodic.

41. The method of claim 39, wherein said supplying of the second gas to the second electrode such that the second plasma is formed includes bombarding a metal surface of the second electrode with high-energy ions.

42. The method of claim 39, wherein said supplying of the second gas to the second electrode such that the second plasma is formed includes heating a metal element of the second electrode until it emits electrons thermionically.

43. The method of claim 39, wherein said supplying of the second gas to the second electrode such that the second plasma is formed is such that no dielectric layer is formed on the second electron.

* * * * *